United States Patent
Kwok et al.

(10) Patent No.: US 11,612,088 B2
(45) Date of Patent: Mar. 21, 2023

(54) ANISOTROPIC HEAT TRANSFER, ELECTROMAGNETIC INTERFERENCE SHIELDING COMPOSITE AND METHOD FOR PREPARATION THEREOF

(71) Applicant: Nano and Advanced Materials Institute Limited, Hong Kong (HK)

(72) Inventors: Chi Ho Kwok, Hong Kong (HK); Mei Mei Hsu, Hong Kong (HK); Ka I Lee, Hong Kong (HK); Chenmin Liu, Hong Kong (HK)

(73) Assignee: Nano and Advanced Materials Institute Limited, Hong Kong (HK)

( * ) Notice: Subject to any disclaimer, the term of this patent is extended or adjusted under 35 U.S.C. 154(b) by 0 days.

(21) Appl. No.: 17/480,152

(22) Filed: Sep. 21, 2021

(65) Prior Publication Data
US 2022/0132709 A1   Apr. 28, 2022

Related U.S. Application Data

(60) Provisional application No. 63/106,371, filed on Oct. 28, 2020.

(51) Int. Cl.
*H05K 9/00* (2006.01)
*D01D 5/00* (2006.01)
(Continued)

(52) U.S. Cl.
CPC .............. *H05K 9/009* (2013.01); *D01D 1/02* (2013.01); *D01D 5/003* (2013.01); *D01G 13/00* (2013.01);
(Continued)

(58) Field of Classification Search
CPC ....................................................... H05K 9/009
See application file for complete search history.

(56) References Cited

U.S. PATENT DOCUMENTS

| 8,460,790 B2* | 6/2013 | Ochi | ........................ D01F 6/04 |
| | | | 442/361 |
| 9,005,755 B2* | 4/2015 | Ledford | ............... D03D 15/275 |
| | | | 428/368 |

(Continued)

FOREIGN PATENT DOCUMENTS

| CN | 101589182 A | 11/2009 |
| CN | 102668173 A | 9/2012 |
| CN | 106829930 A | 6/2017 |

OTHER PUBLICATIONS

Yu Jin et al., "Electronic Components and Materials", Research progress of graphite/polymer functional composite materials, (2017).

(Continued)

*Primary Examiner* — Hung V Ngo
(74) *Attorney, Agent, or Firm* — Idea Intellectual Limited; Margaret A. Burke; Sam T. Yip

(57) ABSTRACT

The present invention provides an anisotropic, thermal conductive, electromagnetic interference (EMI) shielding composite including a plurality of aligned polymer nanofibers to form a polymer mat or scaffold having a first and second planes of orientation of the polymer nanofibers. The first plane of orientation of the polymer nanofibers has a thermal conductivity substantially the same as or similar to that of the second plane, and the thermal conductivity of the first or second plane of orientation of the polymer nanofibers is at least 2-fold of that of a third plane of orientation of the polymer nanofibers which is about 90 degrees out of the first and second planes of orientation of the polymer nanofibers, respectively, while the electrical resistance of each of the first and second planes is at least 3 orders lower than that of the third plane. A method for preparing the present composite is also provided.

20 Claims, 8 Drawing Sheets

(51) Int. Cl.
*D01D 1/02* (2006.01)
*D01G 13/00* (2006.01)
*D04H 1/74* (2006.01)
*D06M 11/83* (2006.01)

(52) U.S. Cl.
CPC .............. *D04H 1/74* (2013.01); *D06M 11/83* (2013.01); *D10B 2401/16* (2013.01); *D10B 2403/0242* (2013.01); *D10B 2403/0243* (2013.01); *D10B 2403/03* (2013.01)

(56) References Cited

U.S. PATENT DOCUMENTS

| | | | |
|---|---|---|---|
| 2013/0115457 A1* | 5/2013 | Haynie | .................... C08L 77/04 428/401 |
| 2016/0069000 A1 | 3/2016 | Kay et al. | |
| 2018/0080148 A1 | 3/2018 | Westerhoff et al. | |
| 2019/0390037 A1* | 12/2019 | Kinlen | .................... C08L 65/00 |
| 2022/0112654 A1* | 4/2022 | Aminu | .................... D06M 11/83 |

OTHER PUBLICATIONS

Office Action of corresponding China Patent Application No. 202111253103.5 dated Nov. 28, 2022.

\* cited by examiner

PAN-CNTs with Ag seeds

PAN-CNTs with AgNPs

PAN-CNTs with AgNPs and AgNPs on fiber surface

ANISOTROPIC HEAT TRANSFER, ELECTROMAGNETIC INTERFERENCE SHIELDING COMPOSITE AND METHOD FOR PREPARATION THEREOF

CROSS-REFERENCE TO RELATED APPLICATION

This application claims priority from the U.S. provisional patent application No. 63/106,371 filed Oct. 28, 2020, and the disclosure of which is incorporated herein by reference in its entirety.

COPYRIGHT NOTICE

A portion of the disclosure of this patent document contains material, which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

TECHNICAL FIELD

The present invention relates to a composite with an anisotropic heat transfer and electromagnetic interference (EMI) shielding properties, in particular, a composite formed by a plurality of anisotropic heat transfer and EMI shielding nanofibers mat, and also relates to a method for preparing thereof.

BACKGROUND

There is an increasing awareness of the radiation pollution arising from different devices nowadays. EMI shielding materials are also important to some industries which require free-of-EMI environment to operate such as aircraft, aerospace and some smart electronics. Therefore, EMI shielding materials or apparatuses with lightweight, flexibility, and also high efficiency are of great demand. However, conventional EMI shielding materials may not have all these characteristics. For example, metal foil is one of the common materials with EMI shielding property but is not flexible and sometimes not light in weight. Polymeric matrix composites embedded with conductive fillers for EMI shielding such as silver-nanowire-PI hybrid, MXene-polymer composites, graphene-polymer nanocomposites, and PP-stainless steel fiber composites have also been studied to attempt to solve the problems in metal-based EMI shielding materials. However, in most of these composites, either a high content of conductive fillers is required which leads to poor mechanical and processing properties due to likelihood of aggregation of fillers during formation, or a lower content of conductive fillers may be used but conductivity thereof is severely affected. Also, the common problems in most of the polymer-based conductive filler-containing composites include low thermal conductivity, poor heat resistance, poor weathering resistance, thick, etc.

Another type of EMI shielding materials attracting more attentions recently is porous foam structures such as porous multi-walled carbon nanotube (CNT) water-borne polyurethane composite foam. However, making a shielding-effective composite without sacrificing small thickness is a big challenge, especially when the composite is for use in a flexible, relatively large surface area device.

Therefore, there is a need for a composite formed by an approach that the polymer matrix has a controlled morphology and heat transfer direction while properties such as small thickness, mechanical properties, flexibility, and electrical conductivity thereof are not sacrificed due to the incorporation of anisotropic heat transfer materials into the polymer matrix of the new composite.

SUMMARY OF THE INVENTION

Accordingly, in a first aspect of the present invention, there is provided an anisotropic, electrical and thermal conductive, electromagnetic interference (EMI) shielding composite including a plurality of aligned polymer nanofibers to form a polymer mat or scaffold having a first and second planes of orientation of the polymer nanofibers, and the first plane of orientation of the polymer nanofibers has a thermal conductivity substantially the same as or similar to the thermal conductivity of the second plane, and the thermal conductivity of the first or second plane of orientation of the polymer nanofibers is at least 2-fold of the thermal conductivity of a third plane of orientation of the polymer nanofibers which is about 90 degrees out of the first and second planes of orientation of the polymer nanofibers, respectively, while the electrical resistance of each of the first and second planes of orientation is at least 3 orders lower than that of a third plane of orientation of the polymer nanofibers. Each of the polymer nanofibers in the exemplary embodiment of the present invention is incorporated with a plurality of thermal conductive fillers and a plurality of a first metal compound being electrospun with the polymer to form a plurality of electrospun polymer nanofibers with a core of the thermal conductive fillers and the first metal compound enclosed in the polymer nanofibers. Each of the electrospun polymer nanofibers is further deposited with a plurality of a second metal compound on the polymer nanofibers in order to form the aligned polymer nanofibers, and the polymer mat or scaffold. The composite as-formed from the aligned polymer nanofibers has an overall thermal conductivity of at least about 110 W/mK along the first or second plane of orientation of the polymer nanofibers, but the thermal conductivity along the third plane of orientation of the polymer nanofibers which is about 90 degrees from the first and second planes of orientation of the polymer nanofibers, respectively, is substantially zero. The present composite also has a comparable EMI shielding effectiveness to that of the corresponding pure metal sheet of the first or second metal compound against electromagnetic waves in lower density from 100 MHz to 1.5 GHz or in higher density from 1.5 GHz to 10.0 GHz. The first and second planes of orientation of the aligned polymer nanofibers also have substantially identical or similar electrical conductivities and resistances, while the electrical resistance of each of the first and second planes of orientation is at least 3 orders lower than that of a third plane of orientation of the polymer nanofibers.

In an embodiment, the thermal conductive fillers and the first metal compound are jointly or independently one or more of carbon nanotubes, boron nitrates, aluminium nitride, ceramic polymers and metal nanoparticles.

In an embodiment, the first metal compound comprises one or more of silver, copper, tin, zinc, cadmium, chromium, nickel, platinum, and lead compounds.

In an embodiment, the first metal compound is one or both of silver nitrates or copper (II) sulfates, and is reduced to nanoparticles.

In an embodiment, the second metal compound comprises one or more of silver, nickel, platinum and copper, or the metal alloy thereof.

In an embodiment, the second metal compound is silver nitrates or copper (II) sulfates in nanoparticles.

In an embodiment, the polymer comprises one or more of polyacrylonitrile (PAN), poly(vinylidene fluoride) (PVDF), polyimide (PI), poly(lactic acid) (PLA), caboxymethyl cellulose (CMC), and poly(vinyl pyrrolidone) (PVP).

In an embodiment, the polymer:thermal conductive fillers:first metal compound is in a weight ratio of about 50:1-4:8-32.

In an embodiment, the first metal compound:second metal compound is in a weight ratio of about 1.8:1.

In an embodiment, the second metal compound is deposited on the electrospun polymer nanofibers by one or more of electroless plating, electroplating, physical or chemical deposition methods, such as CVDs, PVDs, PE-CVDs, sputtering and thermal evaporator, etc.

The orientation of the aligned polymer nanofibers can be controlled or adjusted by the direction of the electrospinning of the polymer mixtures during formation.

In a second aspect of the present invention, a method for preparing the composite of the first aspect is provided, where the method includes:
  providing a solution of the thermal conductive fillers including dispersing the thermal conductive fillers into a solvent for a first period of time;
  dissolving the polymers into the solution of the thermal conductive fillers at a temperature for a second period of time to obtain a solution of the thermal conductive fillers and polymers;
  mixing the first metal compound with the solution of the thermal conductive fillers and polymers for a third period of time to obtain a solution of the thermal conductive fillers, polymers and first metal compound;
  electrospinning the solution of the thermal conductive fillers, polymers and first metal compound to generate a plurality of aligned, electrospun polymer nanofibers;
  drying the aligned, electrospun polymer nanofibers;
  reducing the first metal compound to become metal nanoparticles;
  compressing the aligned, electrospun polymer nanofibers to obtain a mat or scaffold of aligned, electrospun polymer nanofibers;
  depositing a solution of the second metal compound onto each of the aligned, electrospun polymer nanofibers electrolessly; and
  sintering the mat or scaffold of the aligned, electrospun polymer nanofibers to obtain the composite.

In one embodiment, the first period of time is about 2 hours.

In one embodiment, the second period of time is about 6 hours and the dissolving of the polymers into the solution of the thermal conductive fillers is at about 90° C.

In one embodiment, the third period of time is about 1 hour.

In one embodiment, the solvent used to dissolve the thermal conductive fillers comprises dimethylformamide (DMF), dimehtylacetamide (DMAC), N-Methyl-2-pyrrolidone (NMP) and acetone.

In one embodiment, the electrospinning is carried out by an electrospinning device set at a voltage of about 20 to 40 kV, feed rate of about 1 to 5 ml/hour, and a rotational speed of about 150 to 300 rpm.

In one embodiment, the drying after the electrospinning is at 100° C. under vacuum.

In one embodiment, the reducing of the first metal compound into nanoparticles comprises subjecting the aligned, electrospun polymer nanofibers to high intensity UV light with about 70% of power and for about 5 minutes on each side of the aligned, electrospun polymer nanofibers.

In one embodiment, the compressing of the aligned, electrospun polymer nanofibers is carried out at about 100° C. to 300° C., 100N to 500N and for about 30 to 300 seconds.

In one embodiment, the depositing of the solution of the second metal compound onto the each of the aligned, electrospun polymer nanofibers electrolessly comprises immersing the aligned, electrospun polymer nanofibers into a solution containing one or both of silver nitrates and copper (II) sulfate for about 20-40 minutes at about 25 to 40° C., followed by rinsing in sufficient amount of deionized water and air drying.

In one embodiment, the sintering is carried out in tube furnace at about 500° C. to 700° C. and for about 10 to 60 minutes.

In one embodiment, the thermal conductive fillers and the first metal compound are jointly or independently one or more of carbon nanotubes, boron nitrates, aluminium nitride, ceramic polymers and metal nanoparticles.

In one embodiment, the first metal compound comprises one or more of silver, copper, tin, zinc, cadmium, chromium, nickel, platinum, and lead compounds.

In one embodiment, the first metal compound is one or both of silver nitrates or copper (II) sulfates, and is reduced to nanoparticles.

In one embodiment, the polymer comprises one or more of polyacrylonitrile (PAN), poly(vinylidene fluoride) (PVDF), polyimide (PI), poly(lactic acid) (PLA), caboxymethyl cellulose (CMC), and poly(vinyl pyrrolidone) (PVP).

In one embodiment, the polymer:thermal conductive fillers:first metal compound is in a weight ratio of about 50:1-4:8-32.

In one embodiment, the first metal compound:second metal compound is in a weight ratio of about 1.8:1.

The present composite is useful in an anisotropic heat transfer material for providing heat dissipation pathway to any device adjacent.

The present composite is also useful in electromagnetic interference shielding apparatus.

BRIEF DESCRIPTION OF THE DRAWINGS

The disclosure will become more fully understood from the detailed description given herein below for illustration only, and thus not limitative of the disclosure, wherein.

The following detailed description explains the preferred embodiments of the invention, together with advantages and features, by way of example with reference to the drawings.

Definitions

The terms "a" or "an" are used to include one or more than one and the term "or" is used to refer to a nonexclusive "or" unless otherwise indicated. In addition, it is to be understood that the phraseology or terminology employed herein, and not otherwise defined, is for the purpose of description only and not of limitation. Furthermore, all publications, patents, and patent documents referred to in this document are incorporated by reference herein in their entirety, as though individually incorporated by reference. In the event of inconsistent usages between this document and those documents so incorporated by reference, the usage in the incorporated reference should be considered supplementary to that of this document; for irreconcilable inconsistencies, the usage in this document controls.

In the methods of preparation described herein, the steps can be carried out in any order without departing from the principles of the invention, except when a temporal or operational sequence is explicitly recited. Recitation in a claim to the effect that first a step is performed, and then several other steps are subsequently performed, shall be taken to mean that the first step is performed before any of the other steps, but the other steps can be performed in any suitable sequence, unless a sequence is further recited within the other steps. For example, claim elements that recite "Step A, Step B, Step C, Step D, and Step E" shall be construed to mean step A is carried out first, step E is carried out last, and steps B, C, and D can be carried out in any sequence between steps A and E, and that the sequence still falls within the literal scope of the claimed process. A given step or sub-set of steps can also be repeated. Furthermore, specified steps can be carried out concurrently unless explicit claim language recites that they be carried out separately. For example, a claimed step of doing X and a claimed step of doing Y can be conducted simultaneously within a single operation, and the resulting process will fall within the literal scope of the claimed process.

DETAILED DESCRIPTION

The present invention will be described in detail through the following embodiments/examples with appending drawings. It should be understood that the specific embodiments are provided for an illustrative purpose only, and should not be interpreted in a limiting manner.

Examples

Figure 1A:
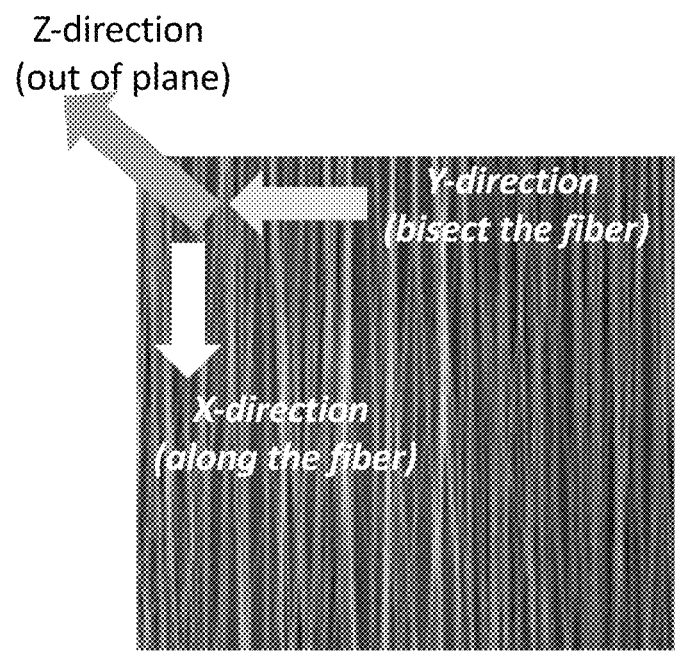
FIG. 1A illustrates the heat transfer direction on different planes of orientation of the aligned polymer nanofibers by electrospinning according to an embodiment of the present invention.
Figure 1B:
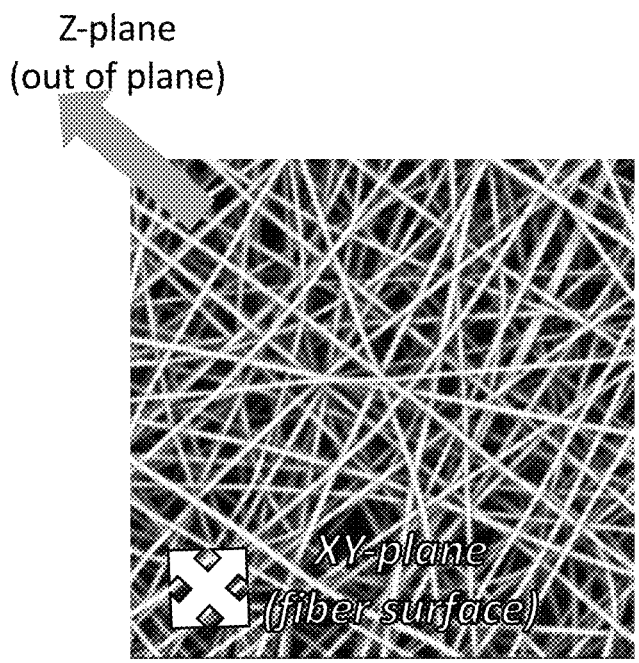
FIG. 1B illustrates the heat transfer direction on different planes of orientation of the non-aligned polymer nanofibers.

Referring to FIGS. 1A and 1B, the difference in the direction of heat transfer between the present composite composed of aligned polymer nanofibers (FIG. 1A) and that composed of non-aligned polymer nanofibers (FIG. 1B) is illustrated. The term "alignment" or its variations used herein refers to alignment of anisotropic and/or isotropic heat transfer materials incorporated into the core and polymer matrix of the nanofibers by means of electrospinning of a solution comprising the polymer(s) forming the matrix of the nanofibers, anisotropic and/or isotropic heat transfer materials in a single direction. In an exemplary embodiment of the present invention, the aligned polymer nanofibers incorporated with at least the anisotropic heat transfer material into the core or polymer matrix thereof have two heat transfer directions where one of the two is along the electrospinning direction of the solution comprising the polymer(s) and the anisotropic heat transfer solution (x-direction in FIG. 1A) while the other is in substantially 90 degrees bisecting the electrospinning direction of the polymer nanofibers (y-direction in FIG. 1A). However, the aligned polymer nanofibers according to the exemplary embodiment of the present invention have substantially zero or very low thermal conductivity value along the direction which is about 90 degrees to both x-direction and y-direction of the heat transfer pathways (i.e., z-direction in FIG. 1A). In a preferred embodiment, the thermal conductivity of the polymer nanofibers along the x- and y-directions is at least 2-fold of that along the z-direction when the thermal conductivity thereof along the z-direction is not zero.

In contrast, the non-aligned polymer nanofibers as shown in FIG. 1B have multiple heat transfer directions, namely x-, y-, and z-directions in FIG. 1B, that they do not have significant difference in thermal conductivity, which makes the composite comprising thereof less efficient in heat dissipation from an adjacent device to the composite. The lower heat transfer efficiency of the non-aligned polymer nanofibers is mainly due to the longer heat dissipation distance from the adjacent device which is with more heat to an area with less heat. In the case of the aligned polymer nanofibers, the heat dissipation distance from the adjacent device to the area with less heat is shorter because the anisotropic heat transfer materials in the core or polymer matrix are aligned in the same direction, resulting in more direct pathway for the heat to transfer along the x- or y-direction of the polymer nanofibers. Because the thermal conductive fillers used as anisotropic heat transfer material in this example are electrically conductive regardless of the alignment, both aligned and non-aligned polymer nanofibers have significantly different electrical conductivities among the three different planes.

Figure 2:
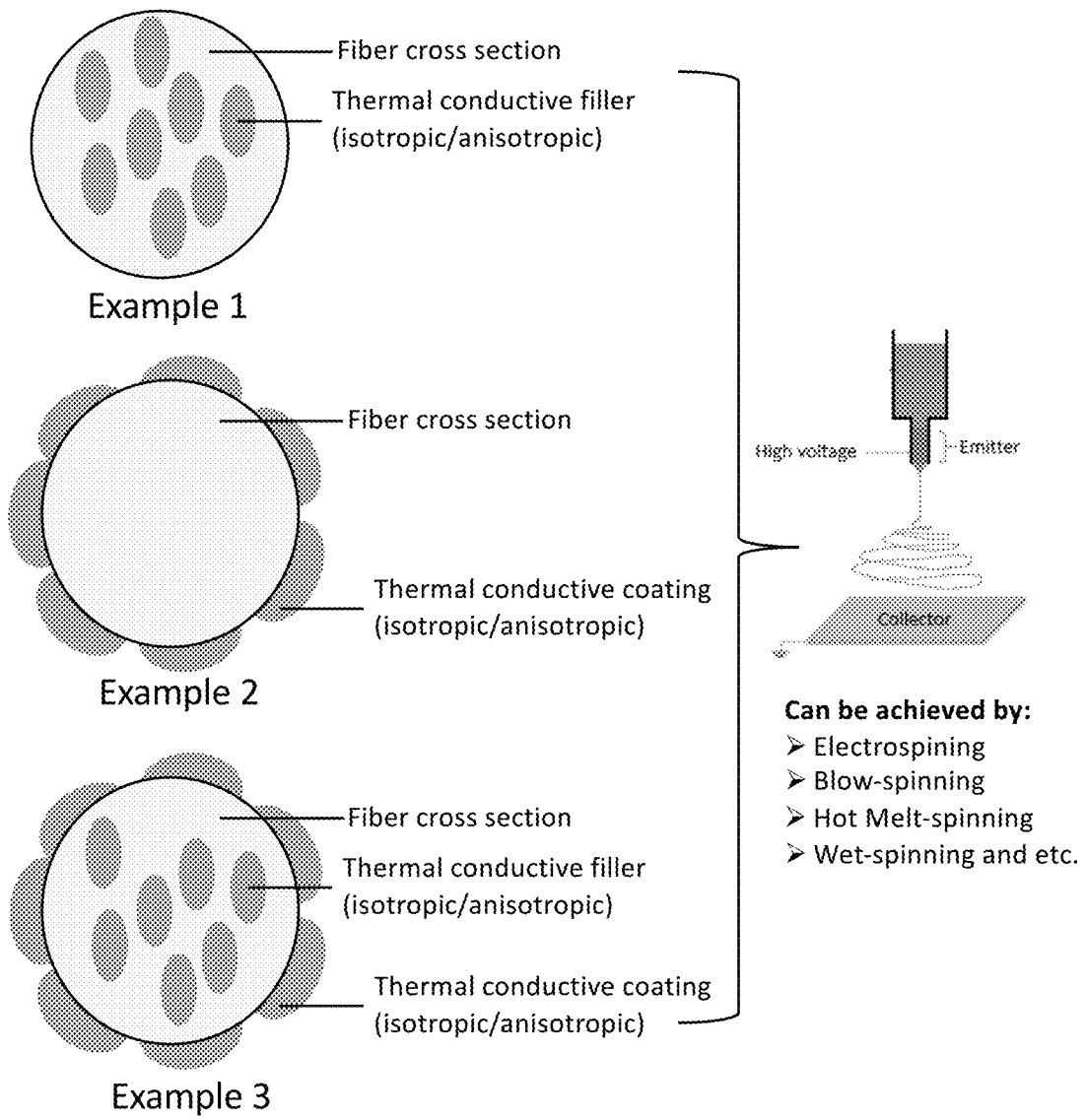
FIG. 2 illustrates three different examples of anisotropic heat transfer polymer nanofibers (left column) and a schematic diagram (right column) showing how the polymer nanofibers are generally prepared according to certain embodiments of the present invention.

Referring to FIG. 2, three different examples of polymer nanofibers are provided schematically from a cross-sectional view. In Example 1, the anisotropic and/or isotropic heat transfer materials are incorporated into the core or polymer matrix of the nanofibers by electrospinning of the solution comprising the polymer(s) and the anisotropic and/or isotropic heat transfer materials. In Example 2, the polymer nanofibers are electrospun without the anisotropic and/or isotropic heat transfer materials, but are deposited with the anisotropic and/or isotropic heat transfer materials on the surface thereof to form a thermal conductive coating. The core or polymer matrix of the nanofibers in Example 2 is devoid of the anisotropic and/or isotropic heat transfer materials. However, control and efficiency of orientation of the anisotropic and/or isotropic heat transfer materials are limited by the method of deposition. In Example 3, the polymer nanofibers are electrospun with the anisotropic and/or isotropic heat transfer materials, followed by deposition with the anisotropic and/or isotropic heat transfer materials on the surface thereof. Both the core or polymer matrix and the surface of the nanofibers have the anisotropic and/or isotropic heat transfer materials. In the presence of the aligned polymer nanofibers incorporated with the anisotropic and/or isotropic heat transfer materials, as illustrated in FIG. 1, the composite formed by the aligned nanofibers will have two directions of heat transfer pathway more thermally conductive than a third direction which is 90 degrees against the plane of the two directions, and the two directions are on the same plane as the plane of electrospinning the polymer nanofibers on the collector. Besides electrospinning, other methods such as blow-spinning, hot melt-spinning and wet spinning, etc., are possible to achieve the alignment of the polymer nanofibers with the anisotropic and/or isotropic heat transfer materials. In this regard, Example 3 in FIG. 2 is a preferred composition of the present polymer nanofibers for forming the composite.

Figure 3:
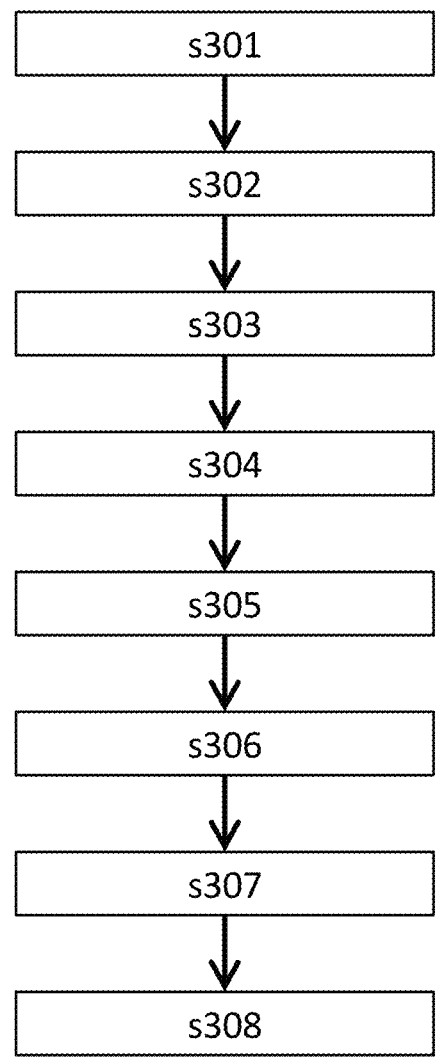
FIG. 3 is a flow chart showing how anisotropic heat transfer polymer nanofibers are prepared by the present method according to an embodiment of the present invention.

Referring to FIG. 3, the method for preparation of the present composite according to an embodiment includes the followings:

s301: preparing a solution of CNT by dispersing about 0.056 g of CNT-COOH into about 38.4 g of DMF solvent with stirring for 2 hours, followed by completely dissolving about 5.6 g of PAN into the CNT solution at 90° C. for around 6 hours to form a PAN/CNT solution;

s302: adding about 1.8 g of $AgNO_3$ into the PAN/CNT solution with stirring for 1 hours to form a PAN/CNT/$AgNO_3$ solution;

s303: electrospinning the PAN/CNT/$AgNO_3$ solution by MECC machine with the conditions as follows: 1) Voltage: 27 kV; 2) Feed rate: 1.7 ml/h; 3) Rotation speed: 150 rpm, in order to form a plurality of PAN/CNT/$AgNO_3$ nanofibers (NF);

s304: drying the PAN/CNT/$AgNO_3$ NF by vacuum oven at 100° C.;

s305: reducing the PAN/CNT/$AgNO_3$ NF to PAN/CNT/Ag nanoparticles (NP) NF by high intensity UV light under the following conditions: 70% power, 5 mins on each side;

s306: compressing PAN/CNT/AgNP NF by Carver press under the following conditions: 100° C., 300N, 30 s;

s307: electrolessly depositing AgNP or CuNP on the PAN/CNT/AgNP NF to form a plurality of PAN/CNT/AgNP—Ag NF or PAN/CNT/AgNP—Cu NF;

s308: sintering the PAN/CNT/AgNP—Ag NF or PAN/CNT/AgNP—Cu NF using tube furnace at inert environment under the following conditions: 500° C., 10 mins.

Table 1 provides the composition of the electrospinning solution for the polymer nanofibers incorporated with the anisotropic heat transfer and metal nanoparticles into the core and polymer matrix of the nanofibers:

TABLE 1

| Solution | PAN (g) | CNT-COOH (g) | $AgNO_3$ (g) | DMF (ml) |
|---|---|---|---|---|
| *PAN/CNT/$AgNO_3$ | 5.6 | 0.112 | 1.8 | 38.4 |

Remarks: *Possible polymers: high molecular weight polymers such as PAN, PVDF, PI, PAN, PLA, CMC, PVP, etc.; possible fillers: high thermal conductive materials such as CNT, BN, AlN, metal nanoparticles, ceramic, etc.

In one embodiment, the electroless plating of the Ag nanoparticles include:
dissolving about 1.0 g of $AgNO_3$ and about 1.0 g of KOH into a 100 mL DI water with stirring to form a brown solution with precipitates;
completely dissolving the brown solution by adding sufficient amount of $NH_3$ (~6 mL) and then adding 4.0 g of glucose into the brown solution;
immersing the PAN/CNT/AgNP NF into the solution for the Ag deposition at 25-30° C. for 40 mins;
rinsing the PAN/CNT/AgNP NF with water and drying at room temperature to obtain PAN/CNT/AgNP—Ag NF.

Table 2 summarizes the concentration of Ag deposition solution for said electroless plating:

TABLE 2

| | $AgNO_3$ (g) | KOH (g) | $NH_3$ (ml) | Glucose (g) | DI water (ml) |
|---|---|---|---|---|---|
| PAN/CNT/AgNP—Ag | 1.0 | 1.0 | ~6 | 4.0 | 100 |

In another embodiment, the electroless plating of Cu nanoparticles includes:
dissolving 1.0 g of $CuSO_4$, 1.8 g of $KNaC_4H_4O_6 \cdot 4H_2O$ (g), 1.2 g of NaOH and 1 mL of HCHO in a 100 mL DI water to form a dark blue solution at 40° C. with stirring;
immersing the PAN/CNT/AgNP NF into the dark blue solution for the Cu deposition at 25-40° C. for 20 mins;
rinsing the PAN/CNT/AgNP NF and drying at room temperature to obtain PAN/CNT/AgNP—Cu NF.

Table 3 summarizes the concentration of Cu deposition solution for said electroless plating:

TABLE 3

| | $CuSO_4$ (g) | $KNaC_4H_4O_6 \cdot 4H2O$ (g) | NaOH (g) | HCHO (mL) | DI water (ml) |
|---|---|---|---|---|---|
| PAN/CNT/AgNP—Cu | 1.0 | 1.8 | 1.2 | 1.0 | 100 |

Other possible metals that can be used for electroless plating and/or incorporation into the core or polymer matrix of the nanofibers include gold, tin, zinc, cadmium, chromium, nickel, platinum, and lead.

Figure 4A:
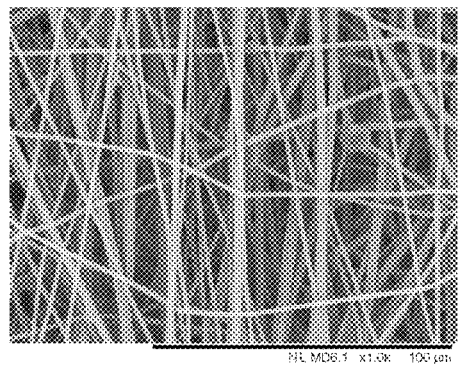
FIG. 4A illustrates microscopically the morphology of an anisotropic heat transfer material-incorporated polymer nanofibers with a metal precursor.
Figure 4B:
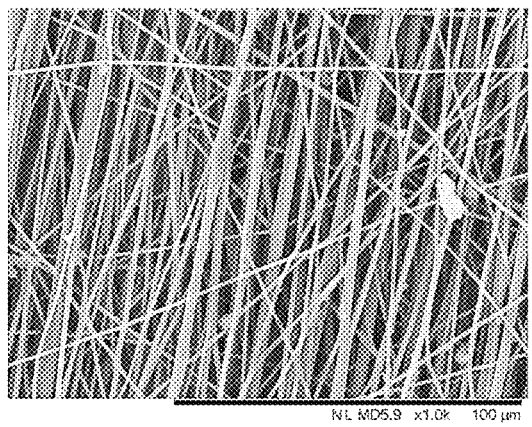
FIG. 4B illustrates microscopically the morphology of an anisotropic heat transfer material and metal nanoparticles-incorporated polymer nanofibers.
Figure 4B:
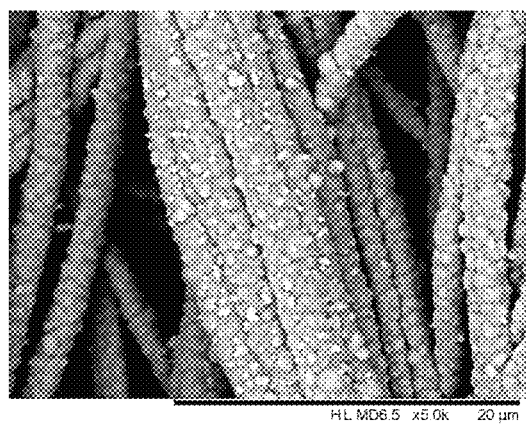
Figure 4C:
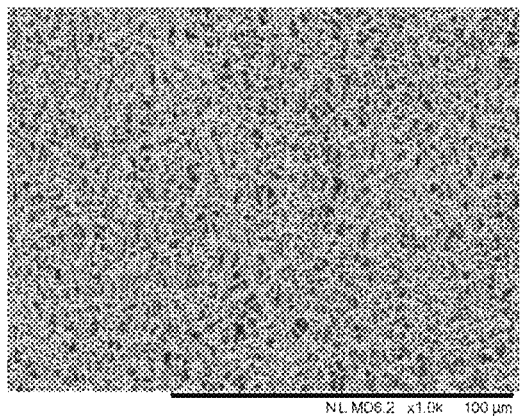
FIG. 4C illustrates microscopically the morphology of an anisotropic heat transfer material and metal nanoparticles-incorporated, metal nanoparticles-coated polymer nanofibers.
Figure 4C:
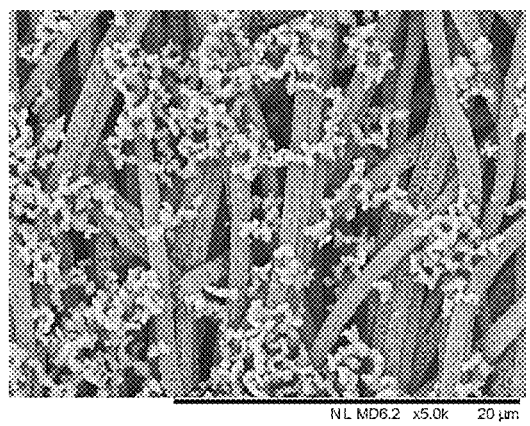

Referring to FIGS. 4A-4C, a series of SEM images are taken for showing the surface morphology of different examples of polymer nanofibers. FIG. 4A shows the morphology of the PNA/CNT NF with the Ag precursors; FIG. 4B shows the morphology of PAN/CNT/AgNP NF in smaller and large magnifications (left and right, respectively); FIG. 4C shows the morphology of PAN/CNT/AgNP—Ag NF in smaller and large magnifications (left and right, respectively).

Figure 5A:
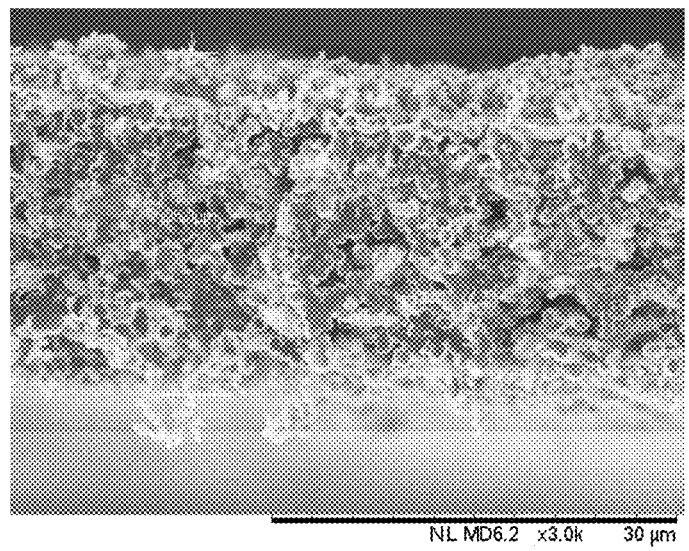
FIG. 5A illustrates microscopically the morphology of an anisotropic heat transfer material and metal nanoparticles-incorporated, metal nanoparticles-coated polymer nanofibers after press from a cross-sectional view.
Figure 5B:
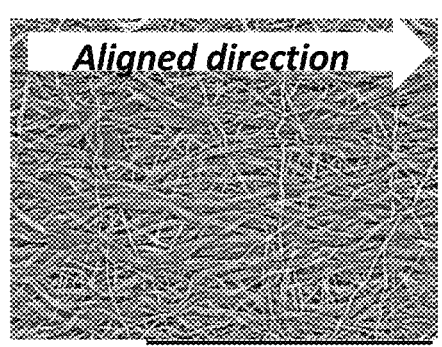
FIG. 5B illustrates the direction of alignment of the anisotropic heat transfer material and metal nanoparticles-incorporated, metal nanoparticles-coated polymer nanofibers as shown in FIG. 5A.
Figure 5C:
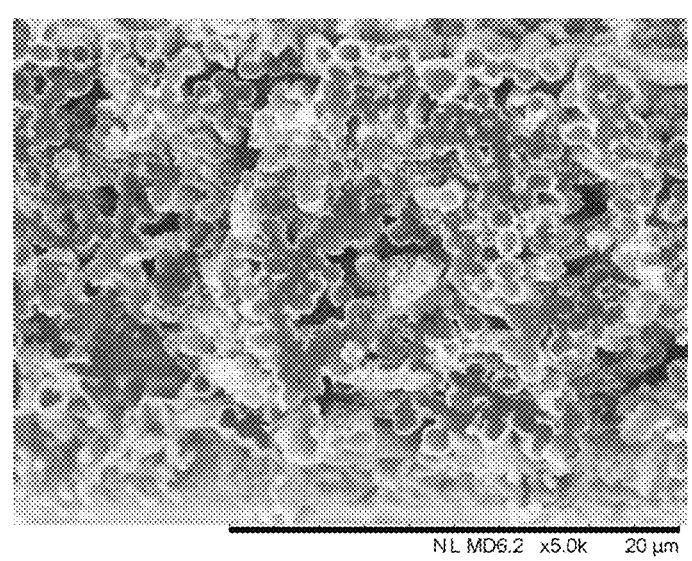
FIG. 5C illustrates microscopically the surface morphology of an anisotropic heat transfer material and metal nanoparticles-incorporated, metal nanoparticles-coated polymer nanofibers after press as shown in FIG. 5A.
Figure 6A:
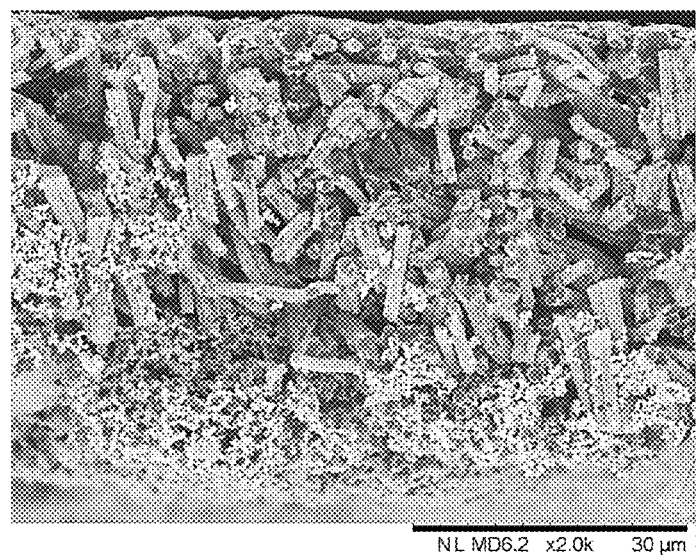
FIG. 6A illustrates microscopically the morphology of an anisotropic heat transfer material and metal nanoparticles-incorporated, metal nanoparticles-coated polymer nanofibers without press from a cross-sectional view.
Figure 6B:
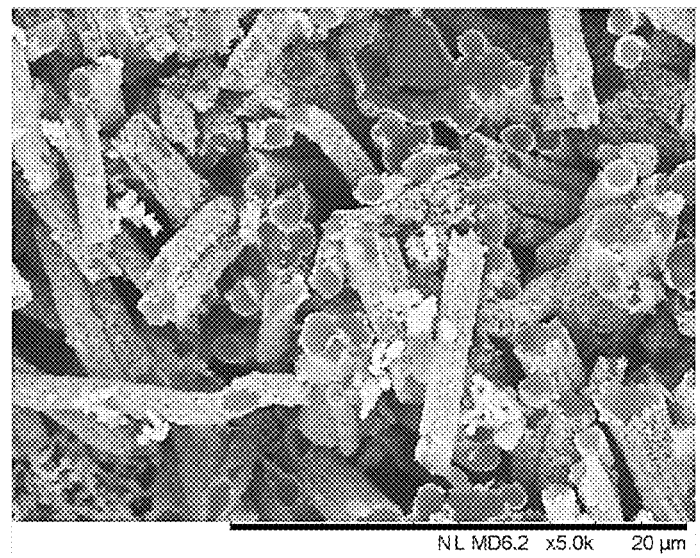
FIG. 6B illustrates microscopically the surface morphology of an anisotropic heat transfer material and metal nanoparticles-incorporated, metal nanoparticles-coated polymer nanofibers without press as shown in FIG. 6A.

Referring to FIGS. 5A-5C, the present composite is shown to become denser after compressing, as compared to a sample of composite without compressing shown in FIGS. 6A-6B. Table 4 summarizes thermal conductivity test results of different samples of composite and also compares the results with those tested in pure metal (Ag and Cu foils). Nanofibers made of the same polymer without the anisotropic and/or isotropic heat transfer materials are also used as control.

As it can be seen, there is a significant difference in thermal conductivity along the x-direction of fiber after sintering (sample 1 and 2), which can be about 2.25 times higher than the non-annealed one. While in x- and y-directions of the orientation of the aligned polymer nanofibers between the sample composites without and with hot press treatment (i.e., samples 2 and 3), which can be from about 40% to 60%, but that along the z-direction does not have significant difference between the sample composites without and with hot press. Beside thermal anisotropy, it was found that aligned nanofiber mat also showed electrical anisotropic properties. It was found that fiber with x and y direction is more electrical, which can be about 3 orders lower than that of z-direction.

Figure 7A:
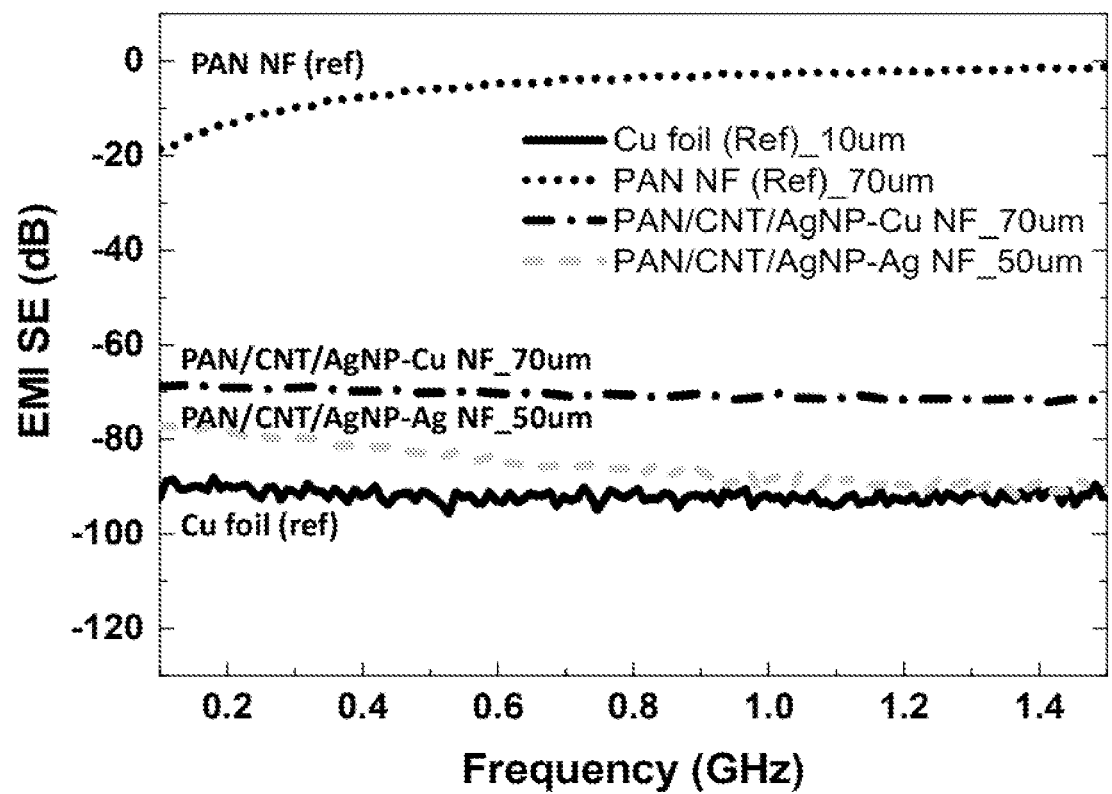
FIG. 7A shows an EMI shielding test results of the composite according to an embodiment of the present invention at low frequency (100M-1.5 GHz)
Figure 7B:
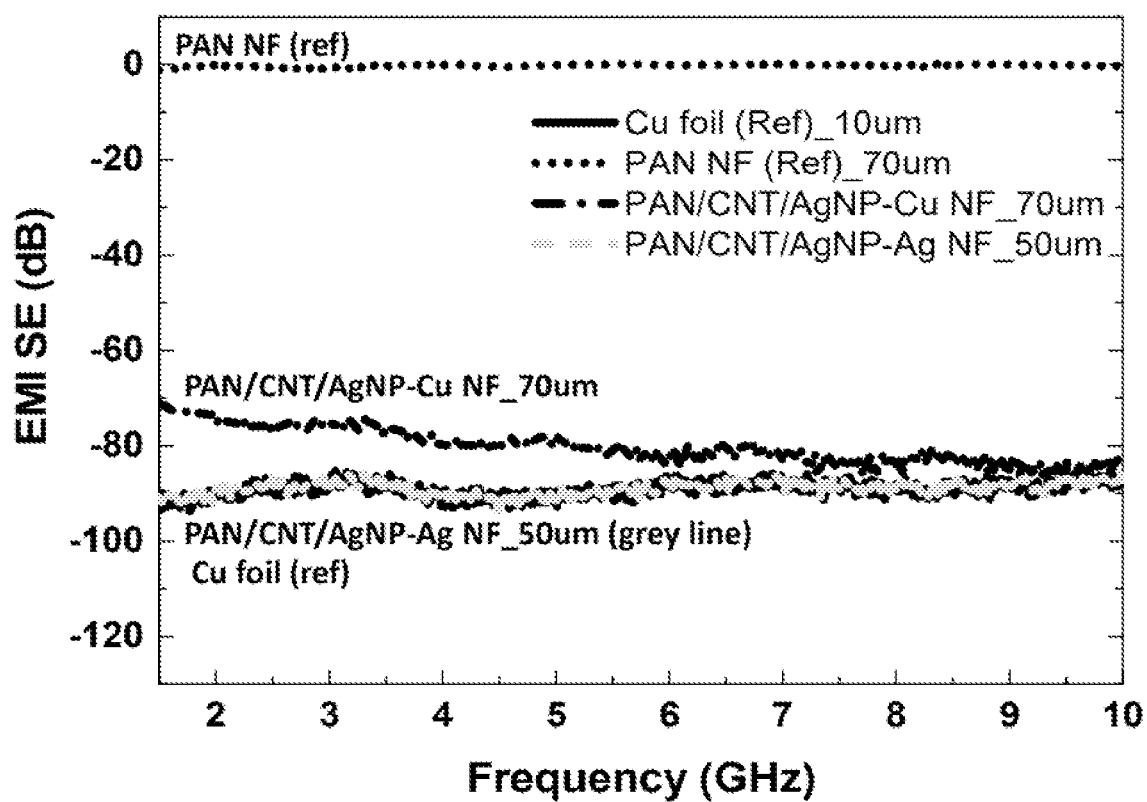
FIG. 7B shows an EMI shielding test results of the same composite as in FIG. 7A but at high frequency (1.5-10 GHz).

Referring to FIGS. 7A-7B, the EMI shielding effectiveness (SE) of the present composites made of PAN/CNT/AgNP—Cu NF and PAN/CNT/AgNP—Ag NF, respectively, is tested at low frequency (100 MHz to 1.5 GHz) and high frequency (1.5 GHz to 30 GHz) of electromagnetic waves, respectively, and compared with that of pure copper foil and composite made of PAN NF only as a control.

TABLE 4

| | Sample | Hot Press | Sintering (temp) | Density (g/cm3) | Direction of heat transfer | Tc (W/mK) | Electrical resistivity (Ohm/cm) |
|---|---|---|---|---|---|---|---|
| | Ag foil (control) | No | No | 10.49 | X, Y and Z | 429 | — |
| | Cu foil (control) | No | No | 8.96 | X, Y and Z | 385 | — |
| | PAN polymer (control) | No | No | 1.18 | X, Y and Z | 0.1-0.2 | — |
| 1 | PAN/2% CNT/AgNP—Ag | No | No | 1.15 | X (alone fiber) | 34.59 | — |
| 2 | PAN/2% CNT/AgNP—Ag | No | Yes (500° C.) | 1.32 | X (alone fiber) | 77.94 | — |
| | | | | | Y (bisect fiber) | 74.82 | — |
| | | | | | Z (through plane) | 0.3752 | — |
| 3 | PAN/2% CNT/AgNP—Ag | Yes | Yes (500° C.) | 1.55 | X (alone fiber) | 120.05 | 0.49 |
| | | | | | Y (bisect fiber) | 110.81 | 0.47 |
| | | | | | Z (through plane) | 0.4483 | 114 |
| 4 | PAN Nanofibers | No | No | 1.18 | Z (through plane) | 0.02832 | — |
| | | | | | Z (through plane) | 0.02824 | — |

Tables 5 and 6 summarize the test results at low frequency and high frequency of EM waves, respectively:

TABLE 5

| | Density (g/cm³) | Resistance (Ω) | EMI SE (dB) | | |
|---|---|---|---|---|---|
| | | | 0.5 GHz | 1.0 GHz | 1.5 GHz |
| Cu foil (Ref) | 5.56 | 0.94 | −91.6 | −92.5 | −92.3 |
| PAN NF (Ref) | 0.28 | ∞ | −5.9 | −3.1 | −1.1 |
| PAN/CNT/AgNP—Cu NF | 0.44 | 1.54 | −69.8 | −70.7 | −71.8 |
| PAN/CNT/AgNP—Ag NF | 1.42 | 0.81 | −83.4 | −87.4 | −90.7 |

Remarks: Test sample size: Ø 15.8 mm

TABLE 6

|  | Density (g/cm³) | Resistance (Ω) | EMI SE (dB) | | | |
| --- | --- | --- | --- | --- | --- | --- |
|  |  |  | 2.5-2.7 GHz | 3.4-3.6 GHz | 4.8-4.9 GHz | 5-10 GHz |
| Cu foil (Ref) | 5.56 | 0.94 | −87.7 | −87.9 | −91.8 | −87.6 |
| PAN NF (Ref) | 0.28 | ∞ | −0.7 | −0.3 | −0.2 | −0.2 |
| PAN/CNT/AgNP—Cu NF | 0.44 | 1.54 | −75.1 | −77.8 | −78.2 | −83.6 |
| PAN/CNT/AgNP—Ag NF | 1.42 | 0.81 | −88.0 | −88.1 | −91.5 | −87.9 |

Remarks: Test sample size: ⌀ 15.8 mm

At low frequency of EM waves, the EMI SE of the composite made of PAN/CNT/AgNP—Ag NF is comparable to that of copper foil at the same thickness while the composite made of PAN/CNT/AgNP—Cu NF is not as good as that made of PAN/CNT/AgNP—Ag NF in terms of EMI SE at low frequency.

At high frequency of EM waves, the EMI SE of the composite made of PAN/CNT/AgNP—Ag NF is similar to or even better than that of copper foil at the same thickness while the composite made of PAN/CNT/AgNP—Cu NF is again not as good as that made of PAN/CNT/AgNP—Ag NF in terms of EMI SE at high frequency of EM waves.

From the EMI SE test results in the present disclosure, it can be concluded that the composite made of PAN/CNT/AgNP NF deposited with silver nanoparticles (AgNP) on the surface thereof is better than that deposited with copper nanoparticles (CuNP), and the composite made of PAN/CNT/AgNP—Ag NF performs well in low and high frequencies of EM waves in terms of EMI SE, especially at high frequency range. The high frequency range used in this series of EMI SE tests is that the EM waves of 5G communication protocol fall within. It therefore also gives an insight that the present composite made of PAN/CNT/AgNP—Ag NF can be a potential candidate of EMI shielding materials used in 5G communication module and infrastructure.

It is also noted from the result of Tables 5 and 6 that the sheet resistance of the composite of PAN/CNT/AgNP—Ag NF is even slightly lower than that of copper foil, at both low and high frequencies of EM waves.

The aligned side of the composite made of PAN incorporated with CNT and AgNP into the core or polymer matrix thereof and deposited with AgNP (PAN/CNT/AgNP—Ag NF) prepared according to the method of the present invention is subject to a bending test with a bending radius of 2.5 cm for 1000 cycles. Thermal conductivity of the composite before and after the bending test for 1000 cycles is compared. The result is summarized in Table 7.

TABLE 7

|  |  |  |  | Tc (W/mK) | |
| --- | --- | --- | --- | --- | --- |
|  | Thickness (μm) | Power (mW) | Time (s) | Before bending | After bending (1000 times) |
| PAN/CNT/AgNP—Ag NF (Aligned side) | 350 | 120 | 2 | 68.80 | 63.95 |

As it can be seen from the results in Table 7, the change in thermal conductivity on the aligned side of the composite made of PAN/CNT/AgNP—Ag NF before and after 1000 cycles of bending at bending radius of 2.5 cm is about 7.05% decrease, which is in an acceptable range when it is applied to devices such as wearables which require sufficient flexibility of the thermal conductive material.

INDUSTRIAL APPLICABILITY

The present invention is applicable in many different electronic devices and a wide range of telecommunication systems and infrastructures because of its dual functions in efficient heat dissipation and EMI shielding property from low to high frequency ranges of EM waves.

The invention claimed is:

1. An anisotropic, electrical conductive and thermal conductive, electromagnetic interference shielding composite comprising:
    a plurality of aligned polymer nanofibers to form a polymer mat or scaffold having a first plane and a second plane of orientation of the polymer nanofibers with a thermal conductivity of at least 2-fold higher than that of a third plane of orientation of the polymer nanofibers,
    each of the polymer nanofibers being incorporated with a plurality of thermal conductive fillers and a plurality of a first metal compound electrospun with a polymer to form a plurality of electrospun polymer nanofibers with a core or polymer matrix of the thermal conductive fillers and the first metal compound in the polymer nanofibers and deposited with a plurality of a second metal compound on the surface of the electrospun polymer nanofibers to form the plurality of aligned polymer nanofibers,
    the composite having the thermal conductivity of at least about 110 W/mK along the first and second planes of orientation of the polymer nanofibers and an electromagnetic interference shielding effectiveness against electromagnetic waves at lower frequency from 100 MHz to 1.5 GHz or higher frequency from 1.5 GHz to 30.0 GHz comparable to or slightly higher than that of the corresponding pure metal of the first or second metal compound, and
    the first and second planes of orientation of the aligned polymer nanofibers having substantially identical or similar electrical conductivities and resistances which the electrical resistance of each of the first and second planes of orientation is at least 3 orders lower than that of a third plane of orientation of the polymer nanofibers.

2. The composite of claim 1, wherein the thermal conductive fillers and first metal compound are jointly or independently one or more of carbon nanotubes, boron nitrates, aluminum nitride, ceramic polymers and metal nanoparticles.

3. The composite of claim 1, wherein the second metal compound comprises one or more of silver, nickel, platinum and copper, or the metal alloy thereof.

4. The composite of claim 1, wherein the polymer comprises one or more of polyacrylonitrile (PAN), poly(vinylidene fluoride) (PVDF), polyimide (PI), poly(lactic acid) (PLA), caboxymethyl cellulose (CMC), and poly(vinyl pyrrolidone) (PVP).

5. The composite of claim 1, wherein the polymer:thermal conductive fillers:first metal compound is in a weight ratio of about 50:1-4:8-32.

6. The composite of claim 1, wherein the first metal compound:second metal compound is in a weight ratio of about 1.8:1.

7. The composite of claim 1, wherein the second metal compound is deposited on the electrospun polymer nanofibers by one or more of electroless plating, chemical vapor deposition, physical vapor deposition, plasma-enhanced chemical vapor deposition and thermal evaporation methods.

8. A method for preparing the composite of claim 1, comprising:
providing a solution of the thermal conductive fillers including dispersing the thermal conductive fillers into a solvent for a first period of time;
dissolving the polymer into the solution of the thermal conductive fillers at a temperature for a second period of time to obtain a solution of the thermal conductive fillers and polymer;
mixing the first metal compound with the solution of the thermal conductive fillers and polymer for a third period of time to obtain a solution of the thermal conductive fillers, polymer and first metal compound;
electrospinning the solution of the thermal conductive fillers, polymer and first metal compound to generate a plurality of aligned, electrospun polymer nanofibers;
drying the aligned, electrospun polymer nanofibers;
reducing the first metal compound to become metal nanoparticles;
compressing the aligned, electrospun polymer nanofibers to obtain a mat or scaffold of aligned, electrospun polymer nanofibers;
depositing a solution of the second metal compound onto each of the aligned, electrospun polymer nanofibers electrolessly; and
sintering the mat or scaffold of the aligned, electrospun polymer nanofibers to obtain the composite.

9. The method of claim 8, wherein the solvent used to dissolve the thermal conductive fillers comprises dimethylformamide (DMF), dimehtylacetamide (DMAC), N-Methyl-2-pyrrolidone (NMP) and acetone.

10. The method of claim 8, wherein the electrospinning is carried out by an electrospinning device set at a voltage of about 20 to 40 kV, feed rate of about 1 to 5 ml/hour, and a rotational speed of about 150 to 300 rpm.

11. The method of claim 8, wherein the reducing of the first metal compound into nanoparticles comprises subjecting the aligned, electrospun polymer nanofibers to high intensity UV light with about 70% of power and for about 5 minutes on each side of the aligned, electrospun polymer nanofibers.

12. The method of claim 8, wherein the compressing of the aligned, electrospun polymer nanofibers is carried out at about 100° C. to 300° C., 100N to SOON and for about 30 to 300 seconds.

13. The method of claim 8, wherein the depositing of the solution of the second metal compound onto the each of the aligned, electrospun polymer nanofibers electrolessly comprises immersing the aligned, electrospun polymer nanofibers into a solution containing one or both of silver nitrates and copper (II) sulfate for about 20-40 minutes at about 25 to 40° C., followed by rinsing in sufficient amount of deionized water and air drying.

14. The method of claim 8, wherein the sintering is carried out in tube furnace at about 500° C. to 700° C. and for about 10 to 60 minutes.

15. The method of claim 8, wherein the thermal conductive fillers and first metal compounds are one or more of carbon nanotubes, boron nitrates, aluminum nitride, and ceramic polymers and metal nanoparticles.

16. The method of claim 8, wherein the polymer comprises one or more of polyacrylonitrile (PAN), poly(vinylidene fluoride) (PVDF), polyimide (PI), poly(lactic acid) (PLA), caboxymethyl cellulose (CMC), and poly(vinyl pyrrolidone) (PVP).

17. The method of claim 8, wherein the polymer:thermal conductive fillers:first metal compound is in a weight ratio of about 50:1-4:8-32.

18. The method of claim 8, wherein the first metal compound: second metal compound is in a weight ratio of about 1.8:1.

19. An anisotropic heat transfer material comprising the composite of claim 1.

20. An electromagnetic interference shielding apparatus comprising the composite of claim 1.

* * * * *